United States Patent [19]

Nakamura et al.

[11] Patent Number: 4,797,348
[45] Date of Patent: Jan. 10, 1989

[54] METHOD OF FORMING A POSITIVE RESIST PATTERN IN PHOTORESIST OF O-NAPHTHOQUINONE DIAZIDE AND BISAZIDE WITH UV IMAGING EXPOSURE AND FAR UV OVERALL EXPOSURE

[75] Inventors: Yoichi Nakamura, Hiratsuka; Shirushi Yamamoto, Isehara; Takashi Komine, Yokohama; Akira Yokota, Yamato; Hisashi Nakane, Kawasaki, all of Japan

[73] Assignee: Tokyo Ohka Kogyo Co., Ltd., Kanagawa, Japan

[21] Appl. No.: 161,213

[22] Filed: Feb. 17, 1988

Related U.S. Application Data

[60] Continuation of Ser. No. 935,592, Nov. 26, 1986, abandoned, which is a continuation of Ser. No. 690,584, Jan. 11, 1985, abandoned, which is a division of Ser. No. 541,570, Oct. 13, 1983, abandoned.

[30] Foreign Application Priority Data

Oct. 13, 1982 [JP] Japan ............................ 57-179325
Oct. 29, 1982 [JP] Japan ............................ 57-190544
Oct. 29, 1982 [JP] Japan ............................ 57-190545

[51] Int. Cl.⁴ .............................................. G03F 7/26
[52] U.S. Cl. ................................. 430/326; 430/191; 430/192; 430/194; 430/196; 430/197; 430/325; 430/330; 430/166; 430/167; 430/5; 430/311
[58] Field of Search ............... 430/326, 156, 191, 192, 430/194, 197, 296, 175, 330, 325, 196

[56] References Cited

U.S. PATENT DOCUMENTS

| | | | |
|---|---|---|---|
| 3,890,152 | 6/1975 | Ruckert et al. | 430/193 |
| 4,164,421 | 8/1979 | Shinozaki et al. | 430/191 |
| 4,259,430 | 3/1981 | Kaplan et al. | 430/191 |
| 4,326,020 | 4/1982 | Golda et al. | 430/326 |
| 4,377,633 | 3/1983 | Abrahamovich et al. | 430/312 |
| 4,411,978 | 10/1983 | Laridon et al. | 430/326 |
| 4,469,778 | 9/1984 | Iwayanagi et al. | 430/197 |

FOREIGN PATENT DOCUMENTS

| | | | |
|---|---|---|---|
| 60-51739 | 5/1981 | Japan | 430/330 |
| 2079481 | 1/1982 | United Kingdom | 430/194 |

Primary Examiner—Charles L. Bowers, Jr.
Attorney, Agent, or Firm—Wyatt, Gerber, Burke and Badie

[57] ABSTRACT

A dually photosensitive composition useful as a photoresist in the manufacture of ICs and the like electronic devices, which is positively photosensitive by exposure to ultraviolet in a relatively small dose but negatively photosensitive by exposure to ultraviolet in a substantially larger dose than above or by exposure to far ultraviolet light, is obtained by admixing a positive-type photoresist material comprising a novolac resin and an o-naphthoquinone diazide compound with a bisazide compound such as 4,4'-diazidodiphenyl sulfide. The inventive photosensitive composition provides a possibility of developing an ingenious technique for patterning of a photoresist layer on the substrate such as a checkboard-like patterned layer by use of a photomask of a line-and-space pattern.

4 Claims, 3 Drawing Sheets

METHOD OF FORMING A POSITIVE RESIST PATTERN IN PHOTORESIST OF O-NAPHTHOQUINONE DIAZIDE AND BISAZIDE WITH UV IMAGING EXPOSURE AND FAR UV OVERALL EXPOSURE

This is a continuation of application Ser. No. 935,592 filed Nov. 26, 1986 abandoned which is a continuation of application Ser. No. 690,584 filed Jan. 11, 1985 abandoned which is a division of application Ser. No. 541,570, filed Oct. 13, 1983 now abandoned.

BACKGROUND OF THE INVENTION

The present invention relates to a dually photosensitive composition capable of exhibiting solubility behavior in the development both of the positive type and negative type depending on the conditions of exposure to light and to a method for patterning a photoresist layer formed of the photosensitive composition.

In recent electronics industry, the technology of fine patterning for the manufacture of ICs, LSIs, ultra-LSIs and the like is in continuous shift from the conventional wet process to the so-called dry process including dry etching, ion implantation, ion milling and the like techniques. These dry process techniques generally have several advantages not only in the fineness in etching and ion implantation but also in respect of the high dimensional accuracy and controllability in working and sharpness of the pattern edges in comparison with the wet process although the photoresist material used in the dry process is required to have resistance against heat and plasma and other properties in addition to the properties required for the material used in the wet process.

In a process of extremely fine working for, for example, multilayer wiring with high density of integration, on the other hand, patterning is sometimes performed on the surface of a substrate having differences in the surface level. When a photoresist layer is formed on such a surface having differences in level and exposed to light, a problem is that the optimum exposure dose may differ from portion to portion at different surface levels due to the unevenness of the surface adversely influencing the accuracy of fine working. When the photoresist material used on such a stepped surface is of the positive type, the phenomenon of so-called narrowing takes place with a smaller line width at the higher side of the step than at the lower side so that the line width cannot be uniform throughout the surface. This undesirable phenomenon can be eliminated only with extreme difficulties presenting a very serious problem to decrease the accuracy in the extremely fine working for the manufacture of ultra-LSIs and the like fine electronics devices.

As a method for solving this problem, there is proposed the multi-layer process in which the stepped surface of a substrate is provided with a relatively thick undercoating layer of an organic coating composition to have a sufficiently flat surface on which a layer of a photosensitive composition having no miscibility with the undercoating is formed. The upper layer of the photosensitive composition is first patterned by the photolithographic techniques to form a pattern-wise resist layer which serves as a masking layer in the subsequent patterning of the underlying layer of the organic coating composition by plasma etching or solvent development. This multi-layer process is in principle effective in obtaining a patterning almost as fine as desired by substantially eliminating the influences by the stepped surface condition.

A problem of this process in practice is that the patterned photoresist in the upper layer is more or less badly affected in the development of the lower organic layer to be eventually "dissolved away by the solvent for development". Therefore, proper selection of a development solvent for the organic undercoating is essential in this process but no solvents hitherto developed are quite satisfactory in this respect.

Alternatively, a modified multi-layer process is proposed in which a layer of silicon dioxide $SiO_2$ is interposed by the techniques of vapor-phase deposition (CVD) between the organic undercoating layer and the photosensitive layer to form a triple-layer structure. Such a photosensitive material is, however, practically not advantageous because of the complicacy in the manufacturing process.

Thus, it has long been desired to develop a novel photosensitive composition suitable for use in the above described process having outstandingly high solvent resistance without necessitating the intervening layer of silicon dioxide and the like.

SUMMARY OF THE INVENTION

The inventors have continued extensive investigations in view of the above described status of the technology of the photosensitive materials for fine working to develop a novel and improved photosensitive composition having excellent resistance against solvents and good heat resistance and arrived at a discovery that a very desirable photosensitive composition is obtained by combining an o-naphthoquinone diazide-based photoresist material of the positive type and a bisazide compound having photosenitivity in a different wavelength region of light from that for the former.

Thus, the photosensitive composition provided by the present invention comprises a bisazide compound represented by the general formula

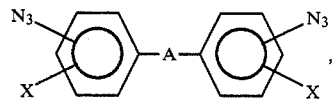

in which A is a divalent atom of oxygen or sulfur or a divalent group of $S_2$, $SO_2$ or $CH_2$ and X is a hydrogen atom or a chlorine atom.

The above described inventive photosensitive composition is unique in that it has a dual photosensitivity that the photosensitive composition behaves as a positive-type one by the irradiation with ultraviolet light up to a certain dose while it behaves as a negative type one by the irradiation with far ultraviolet light or by the irradiation with ultraviolet light in a dose exceeding the region in which the photosensitivity behavior thereof is of the positive type.

The above mentioned unique dual photosensitivity of the inventive photosensitive composition provides a wide versatility to the application of the composition to the preparation of a photolithographic material in accordance with diversified requirements in addition to the high resolving power capable of giving a vary sharp pattern of the resist layer with excellent resistance against solvents and good heat resistance.

DETAILED DESCRIPTION OF THE PREFERRED EMBODIMENTS

Figure 1:
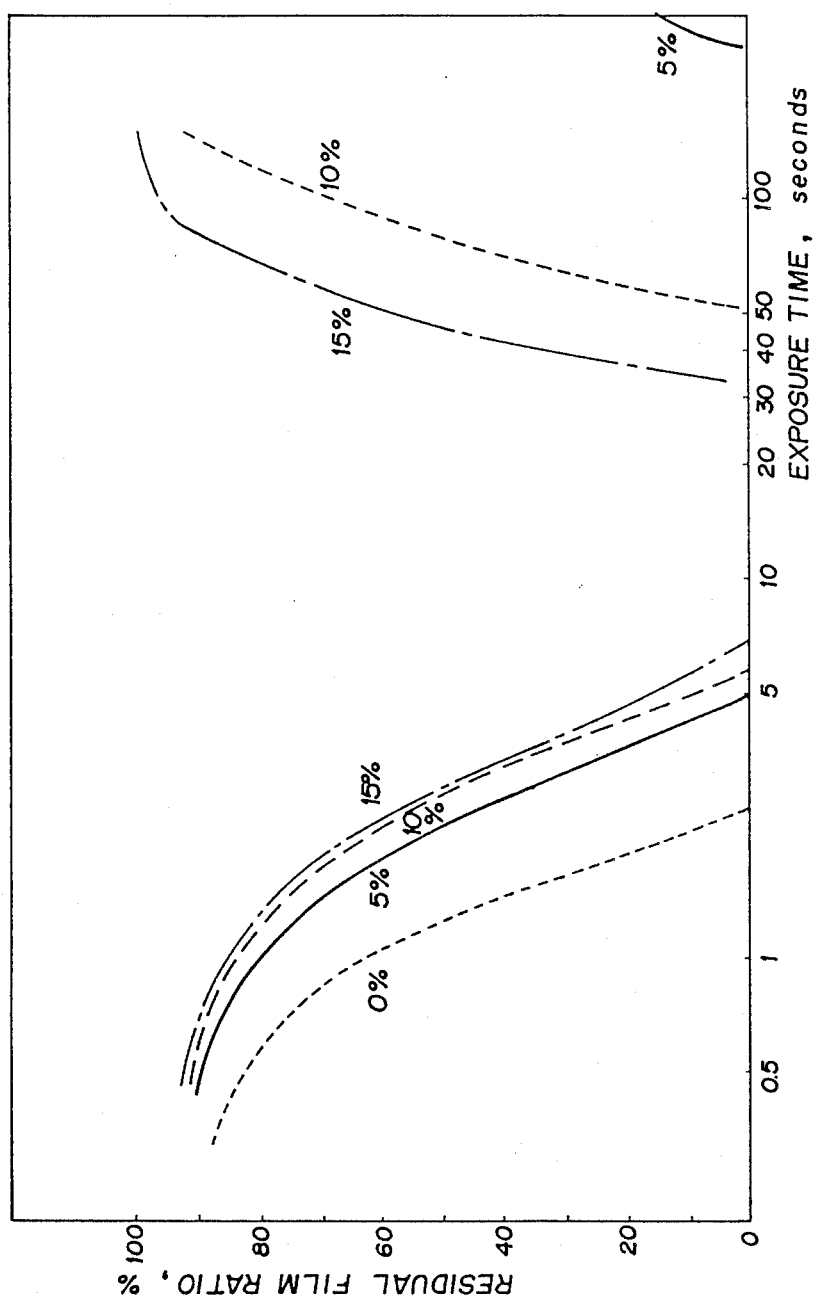
FIG. 1 shows the photosensitivity curves by the ultraviolet exposure of the inventive photosensitive compositions and a composition without addition of a bisazide compound.

One of the essential components in the inventive photosensitive composition is the bisazide compound represented by the above given general formula, which is a photosensitive compound cross-linkable by the irradiation with far ultraviolet light in the wavelength region of 200 to 330 nm. In the general formula, each of the symbols X is a hydrogen atom or a chlorine atom independently from the other. That is, the bisazide compound may have one hydrogen and one chlorine atoms or two hydrogen or chlorine atoms in a molecule. Such a bisazide compound is exemplified by 4,4'-diazidodiphenyl ether, 4,4'-diazidodiphenyl sulfide, 4,4'-diazidodiphenyl sulfone, 3,3'-diazidodiphenyl sulfone, 4,4'-diazidodiphenyl methane, 3,3'-dichloro-4,4'-diazidodiphenyl methane, 4,4'-diazidodiphenyl disulfide and the like, of which 4,4'-diazidodiphenyl sulfide is preferred with its high photosensitivity as a negative type one as well as the excellent γ value and the resolving power.

The o-naphthoquinone diazide-based photoresist material of the positive type used in the inventive photosensitive composition on the other hand, is a composition prepared by mixing a novolac type phenolic resin as a condensation product of formaldehyde and a phenolic compound as the base resin and an o-naphthoquinone diazide compound, which is usually a naphthoquinone-1,2-diazido-2-sulfonic acid ester, and has a photosensitivity to be solubilized by the irradiation with ultraviolet light in the wavelength region of 200 to 500 nm. Photosensitive compositions of this type are widely used in the photolithography and several commercial products are available including, for example, those of the OFPR series (manufactured by Tokyo Ohka Kogyo Co.), those of the AZ series (manufactured by Hoechst Co.), those of the KMPR series (manufactured by Kodak Co.), those of the HPR series (Philip A. Hunt Chemical Corp.), Microposit (manufactured by Shipley Co., Inc.) and the like.

The amount of the bisazide compound in the inventive photosensitive composition is in the range from about 0.1 to 50 parts by weight or, preferably, from about 10 to 20 parts by weight per 100 parts by weight of the solid content in the o-naphthoquinone diazide-based photoresist material although the mixing ratio should be determined in accordance with the intended application and the desired performance of the photosensitive composition.

Owing to the combination of the o-naphthoquinone diazide-based photoresist material of the positive type and the specific bisazide compound having different photosensitivity in respect of the wavelength region, the photosensitive layer formed of the inventive photosensitive composition has a very unique dual photosensitivity performance that the image formation of the photosensitive layer is of the positive type when irradiated with ultraviolet light of up to a certain dose while it exhibits a negative type photosensitivity when irradiated with far ultraviolet light or with ultraviolet light of the dose exceeding the range in which the photosensitivity is of the positive type.

The above mentioned dual photosensitivity of the inventive photosensitive composition is explained in further detail with reference to the accompanying drawing.

FIG. 1 illustrates the photosensitivity curves in the ultraviolet irradiation of the three photosensitive compositions according to the invention prepared by admixing 5, 10 or 15 parts by weight of 4,4'-diazidodiphenyl sulfide with 100 parts by weight on the solid basis of a positive type photoresist material containing a novolac-type phenolic resin and o-naphthoquinone diazide (OFPR-800, a product by Tokyo Ohka Kogyo Co.). The figure also includes the photosensitivity curve of the same composition but without the addition of 4,4'-diazidodiphenyl sulfide. The photosensitivity curve for each of the compositions was obtained in the following manner.

Thus, the photosensitive composition is applied on to the surface of a silicon wafer by use of a spinner followed by prebaking for 30 minutes at 85° C. in a hot air oven to form a resist film of about 1.3 μm thickness. The thus formed resist layer is then exposed to ultraviolet light on an exposure machine (Model PLA-500, manufactured by Canon Co.) through a glass-made step tablet in contact therewith followed by development with a 2.5% aqueous solution of tetramethylammonium hydroxide as a developer solution for 1 minute at 23° C. to determine the residual film ratio on the area corresponding to each of the steps of the step tablet having a step-wise density gradient. The photosensitivity curve shown in FIG. 1 is obtained by plotting the thus obtained values of the residual film ratios for each composition as a function of the logarithm of the exposure time in seconds. The percentage given to each of the curves in FIG. 1 is the amount of 4,4'-diazidodiphenyl sulfide by weight admixed in the composition based on the solid content of OPFR-800.

Figure 2:
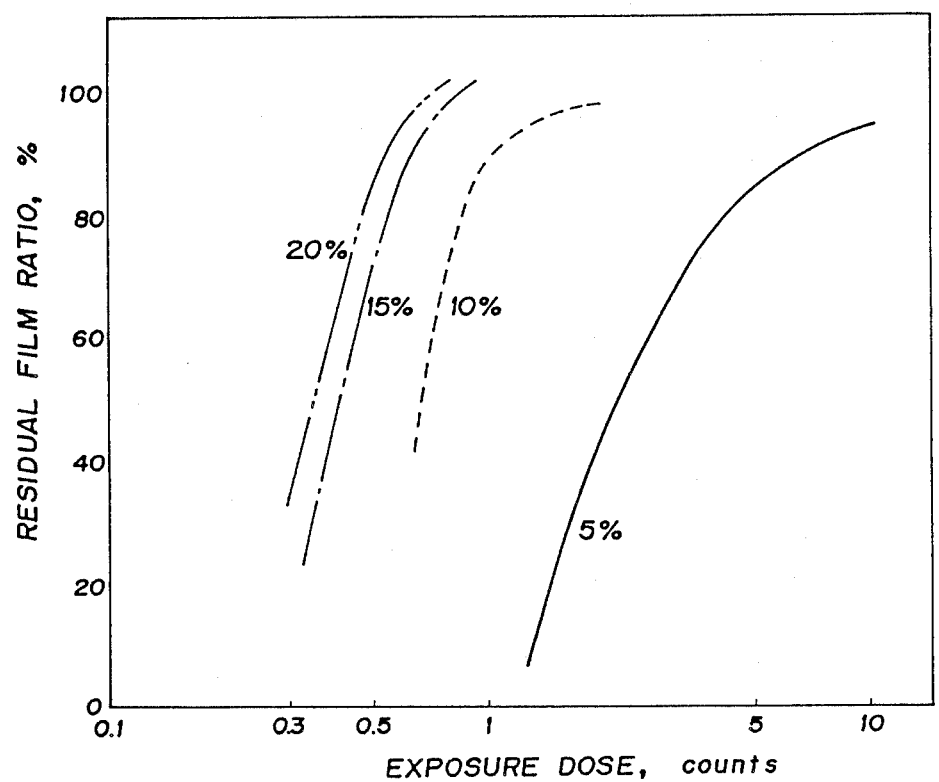
FIG. 2 shows the photosensitivity curves by the far ultraviolet exposure of the inventive photosensitive compositions.

FIG. 2 illustrates similar photosensitivity curves obtained by the far ultraviolet irradiation of four photosensitive compositions prepared in the same manner as above by admixing 5, 10, 15 or 20 parts by weight of 4,4'-diazidodiphenyl sulfide to 100 parts by weight solid of OFPR-800 followed by prebaking of the photoresist layer also in the same manner as above. The residual film ratio in this case was obtained by the far ultraviolet irradiation through a quartz glass-made step tablet followed by a whole-surface exposure to ultraviolet light for 10 seconds and then development with a 2.5% aqueous solution of tetraethylammonium hydroxide under the same conditions as above. The residual film ratio is given on each curve as a function of the logarithm of the far ultraviolet exposure dose in counts, 1 count corresponding to 0.5 second of the exposure time.

As is clear from these figures, the pattern formation with the inventive photosensitive composition by the ultraviolet irradiation follows the positive type photosensitivity with a relatively small exposure dose up to a certain upper limit while the photosensitivity behavior is converted to the negative type when the exposure dose is increased to an extent of substantial excess over the above mentioned upper limit of the positive photosensitivity range. On the other hand, the photosensitivity behavior of the inventive composition is always of the negative type in the far ultraviolet irradiation.

This unique dual photosensitivity behavior of the inventive composition is readily understood by taking into consideration the photosensitivity behavior of the respective components in the inventive composition. Thus, the o-naphthoquinone diazide-based photoresist material of the positive type and the bisazide compound are photosensitive in the wavelength regions of 200 to 500 nm and 200 to 300 nm, respectively, while the spectra of the ultraviolet and far ultraviolet lights used in the above tests extend in the wavelength regions of 280 to 600 nm and 200 to 330 nm, respectively, and the glass and the quartz glass of the step tablets are transparent to the light in the wavelength regions of 300 to 1000 nm and 150 to 1000 nm, respectively. Furthermore, the sensitivity of the o-naphthoquinone diazide-based resist material is sufficiently high in the above mentioned wavelength region of the ultraviolet irradiation but extremely low in the wavelength region of the far ultraviolet irradiation while the sensitivity of the bisazide compound is very low in the wavelength region of the ultraviolet irradiation but sufficiently high in the wavelength region of the far ultraviolet irradiation. As a consequence, the inventive photosensitive composition is versatile in the photolithographic image formation of both the positive and negative types according to desire by suitably selecting the wavelength region of the light used in the exposure.

When a positive type photolithographic image is desired on the surface of a substrate such as a silicon wafer, the inventive photosensitive composition in the form of a solution is uniformly applied on to the substrate surface by use of a spinner and the like followed by drying and prebaking to form a resist film having a thickness of about 0.1 to 2 $\mu$m which is processed by pattern-wise ultraviolet irradiation and development.

When the desired pattern formation is of the positive type, the above prepared photoresist layer is exposed to ultraviolet light pattern-wise through a photomask transparent to ultraviolet such as those made of glass followed by development with a conventional development solution for positive-type photoresist such as an inorganic or organic alkaline solution. The thus formed positive-type photoresist pattern is then subjected to whole-surface exposure with far ultraviolet light to cause crosslinking so that the resist pattern is imparted with greatly increased resistance against heat and solvent.

When the desired pattern formation is of the negative type, on the other hand, the photoresist layer formed on the substrate is exposed to far ultraviolet light pattern-wise through a photomask transparent to far ultraviolet such as those made of fuzed quartz glass followed by whole-surface exposure to ultraviolet light in a dose within the range where the resist material has a positive-type photosensitivity and is solubilized by the irradiation with ultraviolet light. Development of the thus twice exposed photoresist layer with a development solution for positive-type photoresist gives a negative-type patterned resist layer having excellent resistance against heat and solvent because the photoreist material on the areas unexposed to far ultraviolet but exposed to ultraviolet is dissolved away by the development solution while the photoresist material on the areas exposed to both far ultraviolet and ultraviolet remains undissolved.

An alternative method for obtaining a negative-type patterned resist layer is that the photoresist layer is exposed to ultraviolet light pattern-wise through a patterned photomask in such a sufficiently large dose that the photosensitivity behavior of the photoresist material is of the negative type followed by the whole-surface exposure to ultraviolet in such a dose that the photoresist material behaves as a positive-type one and is solubilized by the irradiation with ultraviolet and then by the development with a development solution for positive-type photoresist materials.

The above described procedures for the formation of a positive-type and a negative type patterned photoresist layers having high resistance against heat and solvent can be generalized as follows, in which the photoresist material has a dual photosensitivity behavior of positive type and negative type depending on the types of the radiation for exposure or depending on the dose of exposure to one and the same type of the radiation, the photosensitivity being of the positive type with a relatively small dose of exposure but of the negative type with a relatively large dose of exposure.

Thus, a negative-type patterned photoresist layer is obtained by a first exposure of the photoresist layer pattern-wise with a radiation of the type or in a dose of a radiation capable of forming a negative type pattern followed by a second exposure on whole surface with a radiation of the type or in a dose of the radiation capable of forming a positive pattern and then development of the thus twice exposed photoresist layer.

Further, a positive-type patterned photoresist layer is obtained by a first pattern-wise exposure of the photoresist layer with a radiation of the type or in a dose of the radiation capable of forming a positive type pattern followed by development and then by a second exposure on whole surface with a radiation of the type or in a dose of the radiation capable of forming a negative type pattern of the photoresist material.

The dual photosensitivity behavior of the inventive photoresist composition depending on the exposure dose gives a possibility of a unique process for the formation of a patterned photoresist layer in which the positive-type and negative-type patterns are formed on one and the same substrate surface. That is, a resist layer formed of the inventive photoresist composition is exposed to ultraviolet light in two different doses on a first and a second areas, the doses on the first and the second areas being sufficient for the positive-type and negative-type, respectively, photosensitivity behavior of the photoresist composition, followed by development so that the positive-type and negative-type patterned resist layers are obtained on the different areas of the substrate surface.

As an application of the above mentioned technique, for example, a line-and-space pattern of the resist layer is obtained to have a half width of the line or space by use of a photomask of a line-and-space pattern with a line or space width as large as twice of the line or space width of the pattern on the resist layer. Further, a checkerboard-like pattern of the resist layer can be obtained by use of a photomask of a line-and-space pattern. The procedures therefor are described in detail in the following with reference to the accompanying drawing. In the following description, it is assumed for brevity that the ultraviolet exposure in a unit dose is sufficient to ensure the positive-type photosensitivity behavior of the inventive photosensitive composition while the photosensitivity behavior thereof is reversed to the negative type by the ultraviolet exposure in two units of the dose.

Figure 3A:
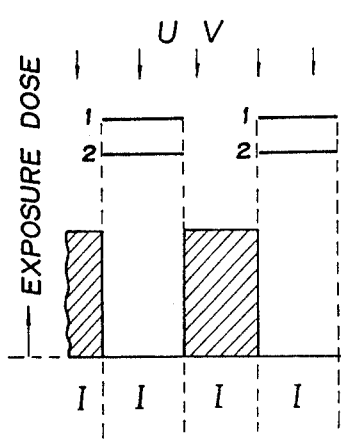
FIGS. 3a to 3c illustrate the principle for the formation of a line-and-space pattern of the resist layer by use of the inventive photosensitive composition.
Figure 3B:
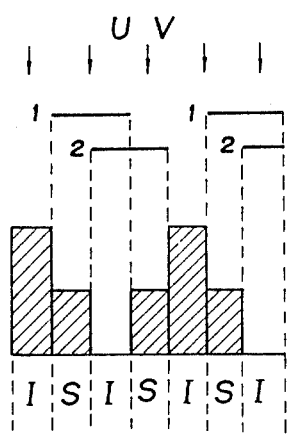
Figure 3C:
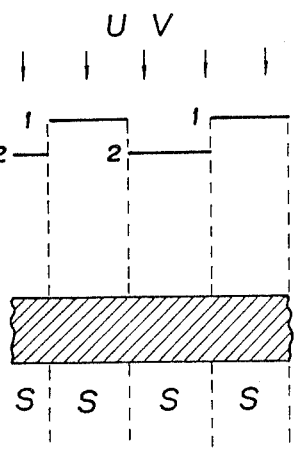

In FIGS. 3a to 3c, the line segments marked 1 and 2 each indicate the position of the masking line on the photomask of a line-and-space pattern in the first and the second exposures, respectively, and the height of the shadowed column represents the exposure dose on the area on which the shadowed column stands. In FIG. 3a, the ultraviolet exposure of the photoresist layer is performed twice each to give a unit of the exposure dose to the unmasked areas with the relative disposition of the photomask and the photoresist layer unchanged. In this case, the photoresist composition on the areas twice irradiated with ultraviolet light has received two units of the exposure dose and the crosslinking reaction thereof has taken place to such an extent that the composition is no longer soluble in any solvents while the composition on the masked and hence unirradiated areas remains also insoluble as it has been at least to certain solvents. That is, the photoresist composition has no solubility over whole surface. The marks "I" below each of the shadowed columns and the masked spaces indicate this insoluble condition of the composition in each of the areas.

Figure 4:
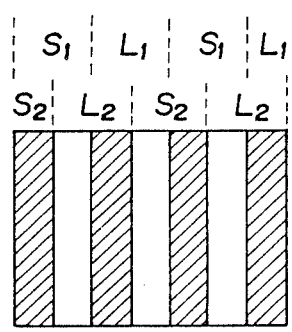
FIG. 4 is a plan view of the line-and-space pattern of the resist layer obtained according to the principle illustrated in FIG. 3b by use of the inventive photosensitive composition.

Turning now to FIG. 3b, the first ultraviolet exposure is performed through a photomask of a line-and-space pattern with each of the masking lines at the position marked with 1 in this figure. When this first ultraviolet exposure is performed to give a unit of the exposure dose to the unmasked areas, the photoresist composition on the thus irradiated areas is solubilized by virtue of the positive-type photosensitivity behavior of the composition while the composition on the unirradiated areas remains insoluble. In the next place, the photomask is displaced relative to the substrate in the direction perpendicular to the direction of the lines on the line-and-space pattern by a distance of a half-line width so as to have each of the masking lines displaced to the position of the line segment 2 in this figure and the second ultraviolet exposure is performed through the photomask also to give a unit of the exposure dose to the unmasked areas. Then, the photoresist layer on the substrate surface can be divided into stripe-wise areas formed of three different kinds of stripes in the amounts of the exposure dose. That is, the photoresist composition on the first class of the stripes has not been masked by the masking lines in both of the first and the second ultraviolet exposures so that the composition has received two units of the exposure dose to be insolubilized by the crosslink formation. The photoresist composition on the second class of the stripes has been masked in the first ultraviolet exposure but unmasked and exposed in the second exposure due to the half-line width displacement of the photomask relative to the substrate so that the exposure dose received in the striped areas of this class is one unit given in the second exposure and the composition is solubilized in these areas due to the positive-type photosensitivity behavior of the composition. The striped areas of the third class have been always masked by the masking lines of the photomask throughout the exposures so that the photoresist composition on these areas retains the initial insolubility without crosslink formation. The marks "I" and "S" below each of the shadowed columns and the portions without the shadowed columns indicate the conditions of insolubility and solubility, respectively, in each of the areas. Development of the thus twice exposed photoresist layer with a development solvent gives a line-and-space pattern illustrated in FIG. 4 in which each of the lines and spaces has a width equal to a half of the line or space width of the line-and-space pattern on the photomask used in the exposures. The symbols $S_1$ and $L_1$ indicate the positions of the spaces and lines on the photomask in the first exposure, respectively, and $S_2$ and $L_2$ indicate the respective positions in the second exposure. The shadowed stripes in FIG. 4 are the areas where the photoresist composition has been insolubilized with two units of the dose or has remained insoluble without ultraviolet exposure and the white stripes indicate the areas where the photoresist composition has been solubilized with a unit of the exposure dose and dissolved away by the development solvent. It may be needless to say that the thus patterned resist layer can be further irradiated over whole surface with far ultraviolet light or ultraviolet light in a sufficiently large dose to insolubilize the composition on the areas unexposed in the first and the second exposures so that the resist layer is imparted with increased resistance against heat and solvents.

FIG. 3c is given to supplementarily illustrate the successive exposures in which the displacement of the photomask relative to the substrate is at a distance equal to the width of the line or space of the line-and-space pattern on the photomask. As is readily understood, the exposure dose received by the photoresist composition is uniform over whole surface and equal to one unit so that the composition has been solubilized throughout and no pattern is obtained by development.

Figure 5:
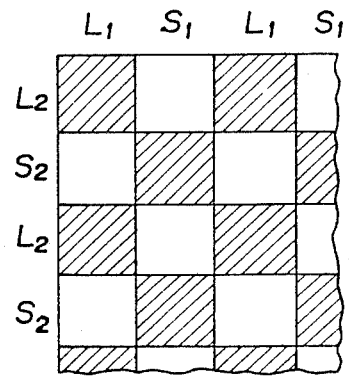
FIG. 5 is a plan view of a checkerboard-like pattern of the resist layer obtained by use of the inventive photosensitive composition.

FIG. 5 illustrates a checkerboard-like pattern of the resist layer formed by the application of the inventive photosensitive composition by use of a photomask of a line-and-space pattern. The first ultraviolet exposure of the photoresist layer formed on a substrate is performed through the photomask having each of the lines and spaces positioned on the down column indicated by the symbols $L_1$ or $S_1$, respectively, so that the areas on the down columns indicated by S receive one unit of the exposure dose. Then, the line-and-space photomask is rotated by 90° relative to the substrate and the second ultraviolet exposure is performed therethrough also to give one unit of the exposure dose to the unmasked areas. The areas extending across and indicated by the symbols $L_2$ and $S_2$ at the left are the areas on the substrate masked and unmasked by the lines and spaces on the photomask, respectively, in this second ultraviolet exposure. It is readily understood that each of the squares formed by the crossing of a down column $S_1$ and an across line $S_2$ is the area having been exposed in both of the two exposures to receive two units of the exposure dose as a total so that the photosensitive composition on these square areas has been insolubilized by the crosslink formation. Each of the square areas formed by the crossing of a down column $L_1$ and an across line $L_2$ is always masked and unexposed throughout the exposures so that the composition on these areas retains the inherent insolubility without crosslinking. On the other hand, each of the square areas formed by the crossing of a down column $S_1$ and an across line $L_2$ or of a down column $L_1$ and an across line $S_2$ has received only one unit of the exposure dose in either the first or the second exposure, respectively, so that the composition on these areas has been solubilized by virtue of the positive-type photosensitivity behavior of the composition in this region of the exposure dose and hence dissolved away by the development with a development solvent. As a result, a checkerboard-like pattern is obtained as illustrated in FIG. 5. If necessary, the thus patterned resist layer in the checkerboard-like manner can be subjected to a whole-surface exposure to far ultraviolet or to ultraviolet light in a sufficiently large dose in order to be imparted with increased resistance against heat and solvents.

Following are the examples to illustrate the inventive photosensitive composition and the methods for the pattern formation of the resist layer by use of the inventive photosensitive composition in more detail.

EXAMPLE 1

A positive-type photoresist composition in the form of a solution containing a novolac-type phenolic resin and naphthoquinone diazide (OFPR-800, a product by Tokyo Ohka Kogyo Co.) was admixed with 4,4'-diazidodiphenyl sulfide in an amount of 15% by weight based on the solid content of the photoresist composition into a uniform solution followed by filtration through a filter having a pore diameter of 0.2 $\mu$m. The thus prepared solution of the photosensitive composition was applied on to the surface of a silicon wafer by use of a spinner and prebaked in an air oven at 85° C. for 30 minutes to give a resist layer of about 1.3 $\mu$m thickness.

The resist-coated silicon wafer was then exposed to ultraviolet light for 10 seconds on an exposure machine (Model PLA-500, manufactured by Canon Co.) through a chromed-line test chart on a glass substrate and developed with a 2.5% aqueous solution of tetramethylammonium hydroxide as a development solution at 23° C. for 1 minute. The pattern formed in this manner was of the positive type and a high-fidelity reproduction of the pattern on the test chart was obtained with a resolving power of at least 0.5 $\mu$m.

EXAMPLE 2

Another silicon wafer provided with a layer of the same photosensitive composition in the same manner as in the preceding example was exposed to far ultraviolet light for 1.2 seconds on an exposure machine (Model PLA-520, manufactured by Canon Co.) through a chromed-line test chart on a fuzed guartz glass substrate followed by a whole-surface exposure with ultraviolet light for 10 seconds on the exposure machine used in Example 1 through an unpatterned glass plate. Subsequent development of the thus twice exposed silicon wafer in the same manner as in Example 1 gave a negative type pattern having a resolving power of 0.75 $\mu$m.

EXAMPLE 3

Two silicon wafers were prepared each having been patterned in the same manner as in Example 1 by the formation of the photoresist layer, exposure to ultraviolet through a test chart and development and one of them was subjected to a secondary whole-surface exposure for 10 seconds with far ultraviolet light.

Separately from the above two silicon wafers, additional two silicon wafers were prepared each having been patterned in the same manner as above except that the photosensitive composition used in this case contained no bisazide compound and one of them was subjected to the secondary whole-surface exposure for 10 seconds with far ultraviolet light.

The above prepared four patterned silicon wafers were put into an oven and post-baked for 20 minutes at 250° C.. The results were that thermal deformation of the pattern took place on the silicon wafers excepting the wafer provided with the bisazide added photoresist layer and subjected to the secondary whole-surface exposure with far ultraviolet indicating the advantages obtained with the inventive photosensitive composition combined with the procedure of two-step exposure. In addition, the solvent resistance of the thus formed pattern was greatly improved in comparison with the patterns on the other three silicon wafers when methyl ethyl ketone or other good solvents were used for testing.

EXAMPLE 4

A silicon wafer was provided with a photoresist layer with the same photosensitive composition in the same manner as in Example 1 and the photoresist layer was exposed to ultraviolet light for 30 seconds through a chromed test chart on a glass substrate having a line-and-space pattern of 2 $\mu$m line width. Thereafter, the silicon wafer mounted on an alignment apparatus was displaced relative to the test chart by a distance of 1 $\mu$m in the direction perpendicular to the lines and a second ultraviolet exposure was performed for 30 seconds through the same test chart. Development of the thus twice exposed silicon wafer in the same manner as in Example 1 gave a line-and-space pattern of the photoresist layer having a line width of 1 $\mu$m.

Similarly, the use of a line-and-space patterned test chart having a line width of 4 $\mu$m and displacement of the silicon wafer by a distance of 2 $\mu$m gave a line-and-space pattern of 2 $\mu$m line width of the photoresist layer on the silicon wafer.

EXAMPLE 5

The same experimental procedure as in the preceding example was repeated except that, in place of the relative displacement of the silicon wafer and the test chart by a distance of 1 $\mu$m or 2 $\mu$m, the silicon wafer was rotated on the same plane relative to the test chart by an angle of 90° before the second ultraviolet exposure. The results were that the photoresist pattern formed on the silicon wafer was checkerboard-like composed of 1 $\mu$m×1 $\mu$m or 2 $\mu$m×2 $\mu$m squares, respectively.

What is claimed is:

1. A method for forming a positive type resist pattern on a substrate by use of a dually photosensitive composition negatively photosensitive under a first condition of exposure to light and positively photosensitive under a second condition of exposure to light which comprises the steps of:
   (a) forming a layer of the dually photosensitive composition in admixture with a novolac type phenolic resin on the substrate;
   (b) subjecting the layer of the dually photosensitive composition to a pattern-wise exposure to light under the second condition of exposure;
   (c) developing the layer of the dually photosensitive composition with an organic or inorganic alkaline solution to form a positive type resist pattern;

(d) subjecting the developed layer of the dually photosensitive composition to a whole-surface exposure to light under the first condition of exposure; wherein the dually photosensitive composition comprises an admixture of an o-naphthoquinone diazide and novolac type phenolic resin based photoresist material of the positive type, and from 5 to 50 parts by weight per 100 parts by weight of the o-naphthoquinone diazide-based photoresist material on a solids basis, of a bis azide compound cross linkable by irradiation with far ultraviolet light in the wavelength region of 200 to 330nm represented by the general formula:

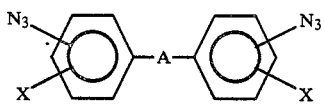

in which A is a divalent atom or group selected from the class consisting of an oxygen atom, a sulfur atom, a disulfide linkage $S_2$, a sulfone linkage $SO_2$ and a methylene group $CH_2$, and X is a hydrogen atom or a chlorine atom; and wherein the step (b) comprises subjecting layer of a dually photosensitive composition to patternwise exposure with ultraviolet light, and the step (d) comprises subjecting the layer of dually photosensitive composition to whole-surface exposure with far ultraviolet light, after developing, to produce a good heat and solvent resistant patterned resist.

2. The method of claim 1 wherein the bisazide compound is selected from the class consisting of 4, 4'-diazidodiphenyl ether, 4,4'-diazidodiphenyl sulfide, 4,4'-diazidodiphenyl sulfone, 3,3'-diazidodiphenyl sulfone, 4,4'-diazidodiphenyl methane, 3,3'-dichloro-4,4'-diazidodiphenyl methane and 4,4'-diazidodiphenyl disulfide.

3. The method of claim 2 wherein the bisazide compound is 4,4'-diazidodiphenyl sulfide.

4. The method of claim 1 wherein the amount of the bisazide compound is in the range from 10 to 20 parts by weight per 100 parts by weight of the o-naphthoquinone diazide-based photoresist material.

* * * * *